United States Patent
Rice

(10) Patent No.: US 11,190,153 B2
(45) Date of Patent: Nov. 30, 2021

(54) RADIO FREQUENCY POWER CIRCUITS UTILIZING COAXIAL RESONATORS FOR VIDEO BANDWIDTH IMPROVEMENTS AND CIRCUIT SIZE REDUCTION AND A PROCESS OF IMPLEMENTING THE SAME

(71) Applicant: Cree, Inc., Durham, NC (US)

(72) Inventor: David Michael Rice, Hollister, CA (US)

(73) Assignee: WOLF SPEED, INC., Durham, NC (US)

(*) Notice: Subject to any disclaimer, the term of this patent is extended or adjusted under 35 U.S.C. 154(b) by 21 days.

(21) Appl. No.: 16/783,595

(22) Filed: Feb. 6, 2020

(65) Prior Publication Data

US 2021/0250001 A1  Aug. 12, 2021

(51) Int. Cl.
| | | |
|---|---|---|
| *H03F 3/193* | (2006.01) | |
| *H03F 1/02* | (2006.01) | |
| *H03H 7/38* | (2006.01) | |
| *H01P 7/04* | (2006.01) | |
| *H03F 3/21* | (2006.01) | |
| *C04B 35/468* | (2006.01) | |

(52) U.S. Cl.
CPC ......... *H03F 3/193* (2013.01); *C04B 35/4682* (2013.01); *H01P 7/04* (2013.01); *H03F 1/0277* (2013.01); *H03F 3/211* (2013.01); *H03H 7/38* (2013.01)

(58) Field of Classification Search
CPC ........ H03F 3/193; H03F 1/0277; H03F 3/211; C04B 35/4682; H01P 7/04; H03H 7/38
USPC ........................................ 330/277
See application file for complete search history.

(56) References Cited

U.S. PATENT DOCUMENTS

2014/0210555 A1\* 7/2014 Liou ................. H03F 1/56
330/296

\* cited by examiner

*Primary Examiner* — Hafizur Rahman
(74) *Attorney, Agent, or Firm* — BakerHostetler

(57) ABSTRACT

A packaged RF power amplifier (RFPA) configured to increase video bandwidth is disclosed as well is a process for implementing a RF power device to increase video bandwidth. The RF power device including at least one transistor; an output matching circuit coupled to an output lead and to the at least one transistor; at least one bias feed circuit coupled to the at least one transistor; and at least one coaxial resonator coupled between the at least one transistor and the at least one bias feed circuit.

20 Claims, 12 Drawing Sheets

RADIO FREQUENCY POWER CIRCUITS UTILIZING COAXIAL RESONATORS FOR VIDEO BANDWIDTH IMPROVEMENTS AND CIRCUIT SIZE REDUCTION AND A PROCESS OF IMPLEMENTING THE SAME

FIELD OF THE DISCLOSURE

The disclosure relates to radio frequency power circuits utilizing coaxial resonators for video bandwidth improvement. The disclosure further relates to radio frequency power circuits utilizing coaxial resonators for circuit size reduction. The disclosure further relates to radio frequency power circuits utilizing coaxial resonators for video bandwidth improvement and circuit size reduction. The disclosure further relates to a process of implementing radio frequency power circuits utilizing coaxial resonators for video bandwidth improvement and/or circuit size reduction.

BACKGROUND OF THE DISCLOSURE

Radio Frequency (RF) power circuits are used in a variety of applications such as base stations for wireless communication systems and the like. The signals amplified by the RF power circuits often include signals that have a high frequency modulated carrier having frequencies in a 400 megahertz (MHz) to 6 gigahertz (GHz) range. A baseband signal that modulates a carrier is typically at a relatively lower frequency and, depending on the application, can be up to 300 MHz or higher.

The RF power circuits are typically designed to provide linear operation without distortion. Input and output impedance matching circuits are typically used to match RF transistors that may have low input and output impedances (e.g., around 1 ohm or less for high power devices), to external transmission lines that provide RF signals to and from the RF power transistor. These external transmission lines have characteristic impedances that are typically about 50 ohms. However, the characteristic impedances could be any value as decided by a designer and/or needed for a particular application and/or system.

The input and output matching circuits typically include inductive and capacitive elements that are used to provide impedance matching between the input and output of the RF power transistor. The input and output matching circuits provide impedance matching for the signal frequencies that are amplified by a RF power transistor, such as those in the 400 MHz to 6 GHz range. The RF power transistors typically connect to a DC power supply that is connected to the RF power transistor output lead through a drain bias line and video bypass circuit. This provides a means of injection of DC bias current to the RF power transistor. The circuitry must also properly bypass the power supply connection at RF and video frequencies.

The use of the video bypass circuit and/or the impedance matching circuits, however, can cause unintended consequences that result in a reduced video bandwidth as well as increasing a circuit size. In particular, a size, configuration, and arrangement of the video bypass circuit and/or the impedance matching circuits generate an effective inductance. For example, the video bypass circuit can typically utilize a microstrip drain bias feed that in part generates an effective inductance. This effective inductance results in a reduced video bandwidth. Moreover, the configuration and arrangement of the video bypass circuit and/or the impedance matching circuits, such as the microstrip drain bias feed, need allocation of a substantial amount of circuit area in order to provide a desired operation. For example, the microstrip drain bias feed requires a substantial amount of circuit area in order to provide a desired operation.

Accordingly, there is a need for implementing a RF power amplifier (RFPA) with a bias feed circuit and/or impedance matching circuits configured to have greater video bandwidth. Moreover, there is a need for implementing a RF power amplifier circuit with a bias feed circuit and/or impedance matching circuits configured to have a reduced effective inductance to increase a video bandwidth. Additionally, there is a need for implementing a RFPA with a bias feed circuit and/or impedance matching circuits configured to have a reduced a circuit size.

SUMMARY OF THE DISCLOSURE

One aspect includes a packaged RF power amplifier (RFPA) configured to increase video bandwidth that includes at least one transistor; an input lead coupled to the at least one transistor; a ground terminal coupled to the transistor; an output lead coupled to the at least one transistor; an output matching circuit coupled to the output lead and to the at least one transistor; at least one bias feed circuit coupled to the at least one transistor; and at least one coaxial resonator coupled between the at least one transistor and the at least one bias feed circuit, where the at least one bias feed circuit is configured to apply a DC bias voltage to the at least one transistor.

One aspect includes a process of implementing a packaged RF power amplifier (RFPA) to increase video bandwidth that includes providing at least one transistor; coupling an input lead to the at least one transistor; coupling a ground terminal to the transistor; coupling an output lead to the at least one transistor; coupling an output matching circuit to the output lead and to the at least one transistor; coupling at least one bias feed circuit to the at least one transistor; and coupling at least one coaxial resonator between the at least one transistor and the at least one bias feed circuit, where the at least one bias feed circuit is configured to apply a DC bias voltage to the at least one transistor.

In this regard, the disclosure is directed utilizing a coaxial resonator, for example, as the drain bias feed of any transistor. Because a length of the coaxial resonator is typically about half a length of a standard microstrip drain bias feed, the effective inductance of the bias feed is reduced, which results in an increase of the video bandwidth of the circuit. Likewise, the disclosure is directed utilizing a coaxial resonator, for example, as an impedance matching circuit of any transistor. Because the length of the coaxial resonator is typically smaller, the effective circuit size is reduced. More specifically, the coaxial resonator replaces the typical lambda/n (where lambda is the wave length of the radio frequency of operation) and (where n is, or can approximately be, 2, 4, 8 . . . , e.g., lambda/4) drain bias feed. This configuration results in almost doubling the video bandwidth capability of the circuit. It also results in a more compact circuit foot print. In one or more aspects, the coaxial resonator may be welded to a device drain lead, soldered to RF matching circuitry, soldered to a drain bias feed, and/or the like.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
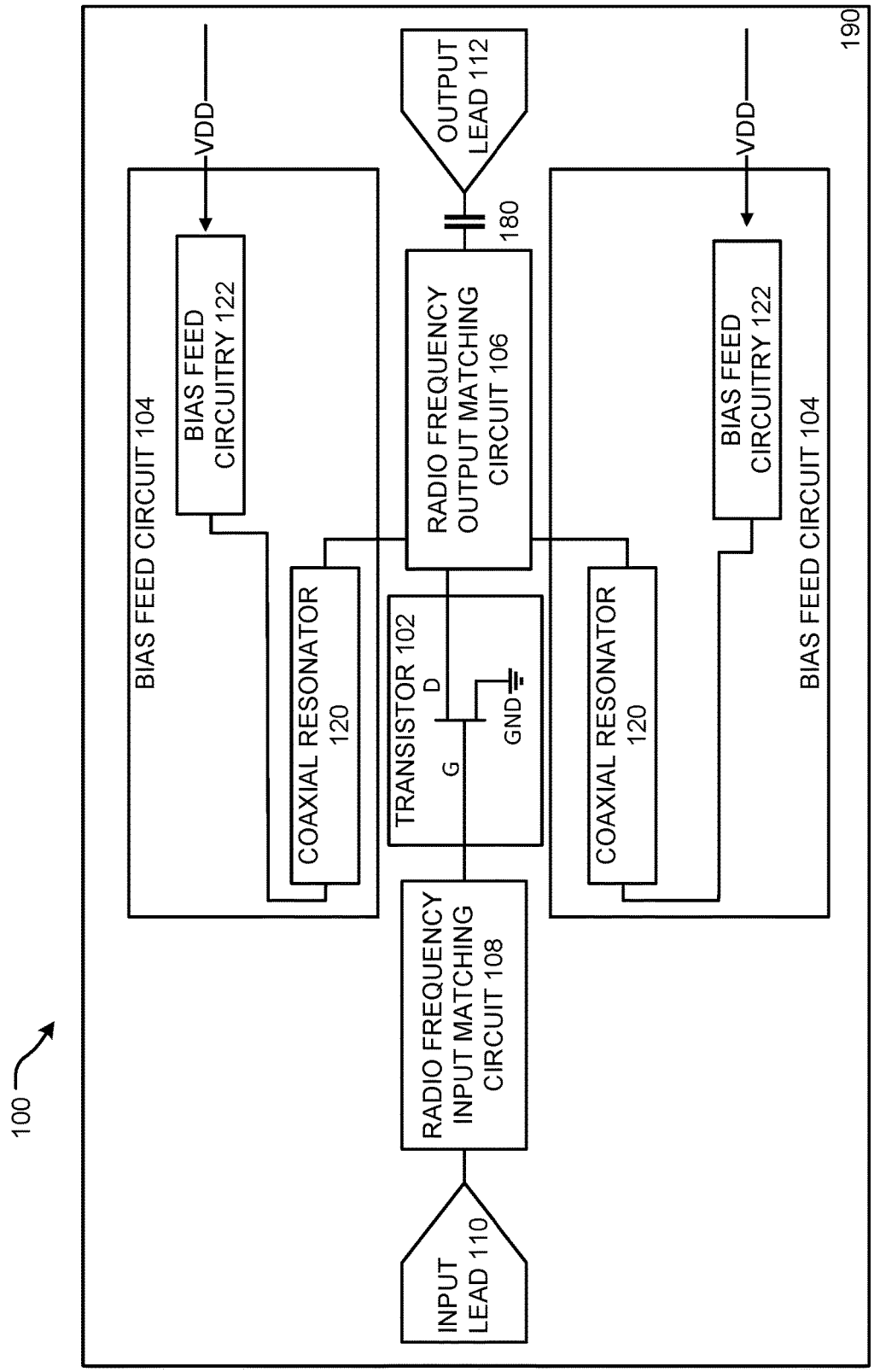
FIG. 1 illustrates a functional block diagram of a packaged RF power amplifier (RFPA) according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law.

Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a functional block diagram of a packaged RF power amplifier (RFPA) package according to the disclosure.

In FIG. 1, an RF power transistor 102 may be mounted in or may be part of a RFPA package 100. The RFPA package 100 may be utilized in or with a base station, a wireless device, a cellular base station communication transmitter, a cellular base station communication amplifier, a RF power amplifier for various cellular bands, a wireless fidelity (Wi-Fi) device, a multiple-input and multiple-output (MIMO) device utilizing IEEE 802.11n (Wi-Fi), IEEE 802.11ac (Wi-Fi), a device implementing HSPA+protocol, a device implementing 3G protocol, a device implementing WiMAX protocol, a device implementing 4G protocol, a device implementing Long Term Evolution (LTE) protocol, a device implementing 5G protocol, a class-A amplifier device, a class-B amplifier device, a class-C amplifier device, a class-AB amplifier device, a Doherty amplifier, and/or the like.

The RF power transistor 102 may be implemented as a Field-Effect Transistor (FET), a Metal-Oxide-Semiconductor Field-Effect Transistor (MOSFET), a Laterally Diffused MOSFET (LDMOS), a Gallium Nitride (GaN) MOSFET, a GaN Laterally Diffused MOSFET (LDMOS), a transistor implemented as an amplifier, a GaN High-Electron-Mobility Transistor (HEMT), a GaN metal-semiconductor field-effect transistor (MESFET) transistor, a bipolar transistor, a discrete device, a Doherty arrangement, any device utilizing a bias feed, and the like. Further, more than one the RF power transistor 102 can be mounted in the RFPA package 100 and connected in parallel. In this regard, a plurality of the RF power transistor 102 may utilize the same type of transistors; and/or a plurality of the RF power transistor 102 may utilize different types of transistors.

In one aspect, the RF power transistor 102 may be implemented as a high-power transistor. In one aspect, the RF power transistor 102 may be implemented as a high-power Laterally Diffused MOSFET (LDMOS), a high-power Gallium Nitride (GaN) MOSFET, a high-power GaN Laterally Diffused MOSFET (LDMOS), a high-power GaN High-Electron-Mobility Transistor (HEMT), and/or a high-power GaN metal-semiconductor field-effect transistor (MESFET) transistor.

In one aspect, the RF power transistor 102 may be implemented as a high-frequency transistor. In one aspect, the RF power transistor 102 may be implemented as a high-frequency Laterally Diffused MOSFET (LDMOS), a high-frequency Gallium Nitride (GaN) MOSFET, a high-frequency GaN Laterally Diffused MOSFET (LDMOS), a high-frequency GaN High-Electron-Mobility Transistor (HEMT), and/or a high-frequency GaN metal-semiconductor field-effect transistor (MESFET) transistor.

In one aspect, the RF power transistor 102 may be implemented as a high-power high-frequency transistor. In one aspect, the RF power transistor 102 may be implemented as a high-power high-frequency Laterally Diffused MOSFET (LDMOS), a high-power high-frequency Gallium Nitride (GaN) MOSFET, a high-power high-frequency GaN Laterally Diffused MOSFET (LDMOS), a high-power high-frequency GaN High-Electron-Mobility Transistor (HEMT), and/or a high-power high-frequency GaN metal-semiconductor field-effect transistor (MESFET) transistor.

Where high-power is defined as a peak power of 10 W-2 kW, a peak power of 100 W-500 W, a peak power of 500 W-1 kW, a peak power of 1 kW-1.5 kW, or a peak power of 1.5 kW-2 kW; and/or where high-power defined as a peak power of greater than 10 W, a peak power greater than 500 W, a peak power greater than 1 kW, a peak power greater than 1.5 kW, or a peak power greater than 2 kW.

Where high-frequency is defined as a frequency of 0.4 GHz-6 GHz, a frequency of 1.4 GHz-1.6 GHz, a frequency of 1.8 GHz-2.7 GHz, a frequency of 1 GHz-2 GHz, a frequency of 2 GHz-3 GHz, a frequency of 3 GHz-4 GHz, a frequency of 4 GHz-5 GHz, or a frequency of 5 GHz-6 GHz; and/or where high-frequency is defined as a frequency greater than 1.4 GHz, a frequency greater than 1.8 GHz, a frequency greater than 2 GHz, a frequency greater than 3 GHz, a frequency greater than 4 GHz, a frequency greater than 5 GHz, or a frequency less than 6 GHz.

A gate G of the RF power transistor 102 may be connected through a radio frequency input matching circuit 108 to an input lead 110. A drain D of the RF power transistor 102 may be connected through a radio frequency output matching circuit 106 to an output lead 112. In some aspects, one or more capacitors 180 may be arranged between the radio frequency output matching circuit 106 and the output lead 112. In particular, connected as described herein may include coupling or connections that may include leads, wire bonding, an adhesive, soldering, sintering, eutectic bonding, thermal compression bonding, ultrasonic bonding/welding, a clip component, and/or the like as described herein. The connection may be through intervening structures or components or the connection may be a direct connection.

The radio frequency output matching circuit 106 may be connected to a bias feed circuit 104. In one aspect, the bias feed circuit 104 may be a single circuit connected to the radio frequency output matching circuit 106 (not shown) to provide a bias feed. In one aspect, the bias feed circuit 104 may be a dual circuit connected to the radio frequency output matching circuit 106 as illustrated to provide dual bias feeds. In one aspect, the bias feed circuit 104 may be implemented as a plurality of circuits connected to the radio frequency output matching circuit 106.

The bias feed circuit 104 may provide a DC bias current to the drain D of the RF power transistor 102. The bias feed circuit 104 may include bias feed circuitry 122 that may receive a voltage VDD. In particular, the bias feed circuitry 122 may include an input that may receive a voltage VDD. Additionally, the bias feed circuitry 122 may include an output connected to a coaxial resonator 120. In particular, the output of the bias feed circuitry 122 may connect to an input of the coaxial resonator 120.

In one aspect, the bias feed circuit 104 may connect to a drain lead of the RF power transistor 102 through the coaxial resonator 120. In particular, an output of the coaxial resonator 120 may be connected to a drain lead of the RF power transistor 102, may be connected to a drain lead of the RF power transistor 102 through intervening structures or components, or may be directly connected to a drain lead of the RF power transistor 102. In one aspect, the coaxial resonator 120 may be welded to a drain lead of the RF power transistor 102.

In one aspect, the bias feed circuit 104 may connect to the radio frequency output matching circuit 106 through a coaxial resonator 120. In particular, an output of the coaxial resonator 120 may be connected to the radio frequency output matching circuit 106, may be connected to the radio frequency output matching circuit 106 through intervening structures or components, or may be directly connected to the radio frequency output matching circuit 106. In one aspect, the coaxial resonator 120 may be soldered to the radio frequency output matching circuit 106.

In one aspect, the bias feed circuit 104 may connect to the radio frequency output matching circuit 106 and the bias feed circuit 104 and may include a coaxial resonator 120. In particular, an output of the coaxial resonator 120 may be connected to the radio frequency output matching circuit 106, may be connected to the radio frequency output matching circuit 106 through intervening structures or components, or may be directly connected to the radio frequency output matching circuit 106. In one aspect, the coaxial resonator 120 may be soldered to a drain bias feed of the radio frequency output matching circuit 106.

As illustrated in FIG. 1, the coaxial resonator 120 is implemented with the bias feed circuit 104. Other configurations implementing the coaxial resonator 120 may include implementing the coaxial resonator 120 within the RFPA package 100, the bias feed circuit 104, the radio frequency output matching circuit 106, the radio frequency input matching circuit 108, the RF power transistor 102, and/or the like.

The coaxial resonator 120 may be configured and implemented to at least partially replace a drain bias feed of the RF power transistor 102. In one aspect, the coaxial resonator 120 may be configured and implemented to replace a drain bias feed of the RF power transistor 102. In one aspect, the coaxial resonator 120 may be configured and implemented to at least partially replace a microstrip drain bias feed or similar structure of the RF power transistor 102. In one aspect, the coaxial resonator 120 may be configured and implemented to replace a microstrip drain bias feed of the RF power transistor 102.

The coaxial resonator 120 may include at least one lead, at least one terminal, and the like. In one aspect, the coaxial resonator 120 may include at least one lead and at least one terminal. As described herein, the coaxial resonator 120 may include at least one lead and at least one terminal configured within the RFPA package 100 to fold on its self. The coaxial resonator 120 may be arranged as described herein and configured to present an RF open function, an RF filtering function, and/or the like as part of the RFPA package 100, the bias feed circuit 104, the radio frequency output matching circuit 106, the radio frequency input matching circuit 108, and/or the like. The coaxial resonator 120 may be implemented as a ceramic element, a ceramic line element, a ceramic coaxial line element, a metallized element, a metallized ceramic element, and/or the like.

Additionally, the coaxial resonator 120 arranged, configured, and/or implemented as described herein may be implemented to have a length and/or an area that is less than a prior art bias feed component, such as a microstrip drain bias feed component. In this regard, the coaxial resonator 120 arranged, configured, and/or implemented as described herein results in a length and/or an area that is 10%-60% less than a prior art bias feed component, 10%-20% less than a prior art bias feed component, 20%-30% less than a prior art bias feed component, 30%-40% less than a prior art bias feed component, 40%-50% less than a prior art bias feed component, or 50%-60% less than a prior art bias feed component. Other reductions in a length and/or area may be achieved depending on an application and/or other factors.

Additionally, the coaxial resonator 120 arranged, configured, and/or implemented as described herein results in an effective baseband ESR (equivalent series resistance) that is less than a prior art bias feed component, such as a microstrip drain bias feed component. In particular, the coaxial resonator 120 arranged, configured, and/or implemented as described herein results in an effective baseband ESR that is less than a prior art bias feed component, such as a microstrip drain bias feed component based in part on a reduced length and/or area. In this regard, the coaxial resonator 120 arranged, configured, and/or implemented as described herein results in an effective baseband ESR that is 10%-60% less than a prior art bias feed component, 10%-20% less than a prior art bias feed component, 20%-30% less than a prior art bias feed component, 30%-40% less than a prior art bias feed component, 40%-50% less than a prior art bias feed component, or 50%-60% less than a prior art bias feed component. Other reductions in effective baseband ESR may be achieved depending on an application and/or other factors.

The above described reduced length, reduced area, and/or reduced effective baseband ESR achieved by the coaxial resonator 120 arranged, configured, and/or implemented as described herein results in an increased video bandwidth of the RF power transistor 102 and/or the RFPA package 100. In particular, the coaxial resonator 120 arranged, configured, and/or implemented as described herein results in an increased video bandwidth of 50% to 150% in comparison to a prior art RF package, an increased video bandwidth of 50% to 60% in comparison to a prior art RF package, an increased video bandwidth of 60% to 70% in comparison to a prior art RF package, an increased video bandwidth of 70% to 80% in comparison to a prior art RF package, an increased video bandwidth of 80% to 90% in comparison to a prior art RF package, an increased video bandwidth of 90% to 110% in comparison to a prior art RF package, an increased video bandwidth of 110% to 130% in comparison to a prior art RF package, or an increased video bandwidth of 130% to 150% in comparison to a prior art RF package.

For example, particular prior art applications of an RFPA package provided a video bandwidth of 195 MHz to 205 MHz. In contrast, the RFPA package 100 implementing the coaxial resonator 120 arranged, configured, and/or implemented as described herein and otherwise implemented consistent with the particular prior art applications of an RF package results in a video bandwidth of 350 MHz-450 MHz, a video bandwidth of 350 MHz-370 MHz, a video bandwidth of 370 MHz-390 MHz, a video bandwidth of 390 MHz-410 MHz, a video bandwidth of 410 MHz-430 MHz, or a video bandwidth of 430 MHz-450 MHz. Other increases in video bandwidth may be achieved depending on an application and/or other factors. For example, other particular prior art applications of an RFPA package may have a frequency of operation of 0.4 GHz-6 GHz, 1.4 GHz-1.6 GHz, 1.8 GHz-2.7 GHz, 1 GHz-2 GHz, 2 GHz-3 GHz, 3 GHz-4 GHz, 4 GHz-5 GHz, or 5 GHz-6 GHz. Accordingly, aspects of the disclosure will provide similar increases in video bandwidth to such prior art applications of an RFPA package.

Accordingly, the RFPA package 100 implementing the coaxial resonator 120 arranged, configured, and/or implemented as described herein may have a circuit size having a reduced length and/or area, a reduced effective baseband ESR, and/or an increased video bandwidth. In this regard, coaxial resonators have been implemented for various typical applications. However, the disclosure has set forth arrangements, configurations, and/or implementations as described herein that have a surprising and/or unexpected result in reducing circuit size length and/or area, reducing effective baseband ESR, and/or increasing video bandwidth. In particular, the disclosure has set forth arrangements, configurations, and/or implementations as described herein that have a surprising and/or unexpected result in reducing circuit size length and/or area, reducing effective baseband ESR, and/or increasing video bandwidth in conjunction with a high-power and/or high-frequency transistor implementation of the RF power transistor 102.

The RFPA package 100 may include a support structure 190. Any one or more of the RF power transistor 102, the bias feed circuit 104, the radio frequency output matching circuit 106, the radio frequency input matching circuit 108, the input lead 110, the output lead 112, the coaxial resonator 120, the bias feed circuitry 122, and/or the like may be arranged on the support structure 190. In one aspect, the support structure 190 may be configured as a printed circuit board (PCB) component utilizing printed circuit board (PCB) manufacturing processes. The PCB may be a single layer PCB configuration or a multiple layer PCB configuration.

The support structure 190 may include one or more metallization layers. Any one or more of the RF power transistor 102, the bias feed circuit 104, the radio frequency output matching circuit 106, the radio frequency input matching circuit 108, the input lead 110, the output lead 112, the coaxial resonator 120, the bias feed circuitry 122, and/or the like may be arranged on one or more metallization layers of the support structure 190. More specifically, the metallization layers may be constructed, configured, and/or arranged on at least a portion of the support structure 190. The one or more metallization layers may include utilizing one or more manufacturing techniques including print screening for solder past, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

Figure 2:
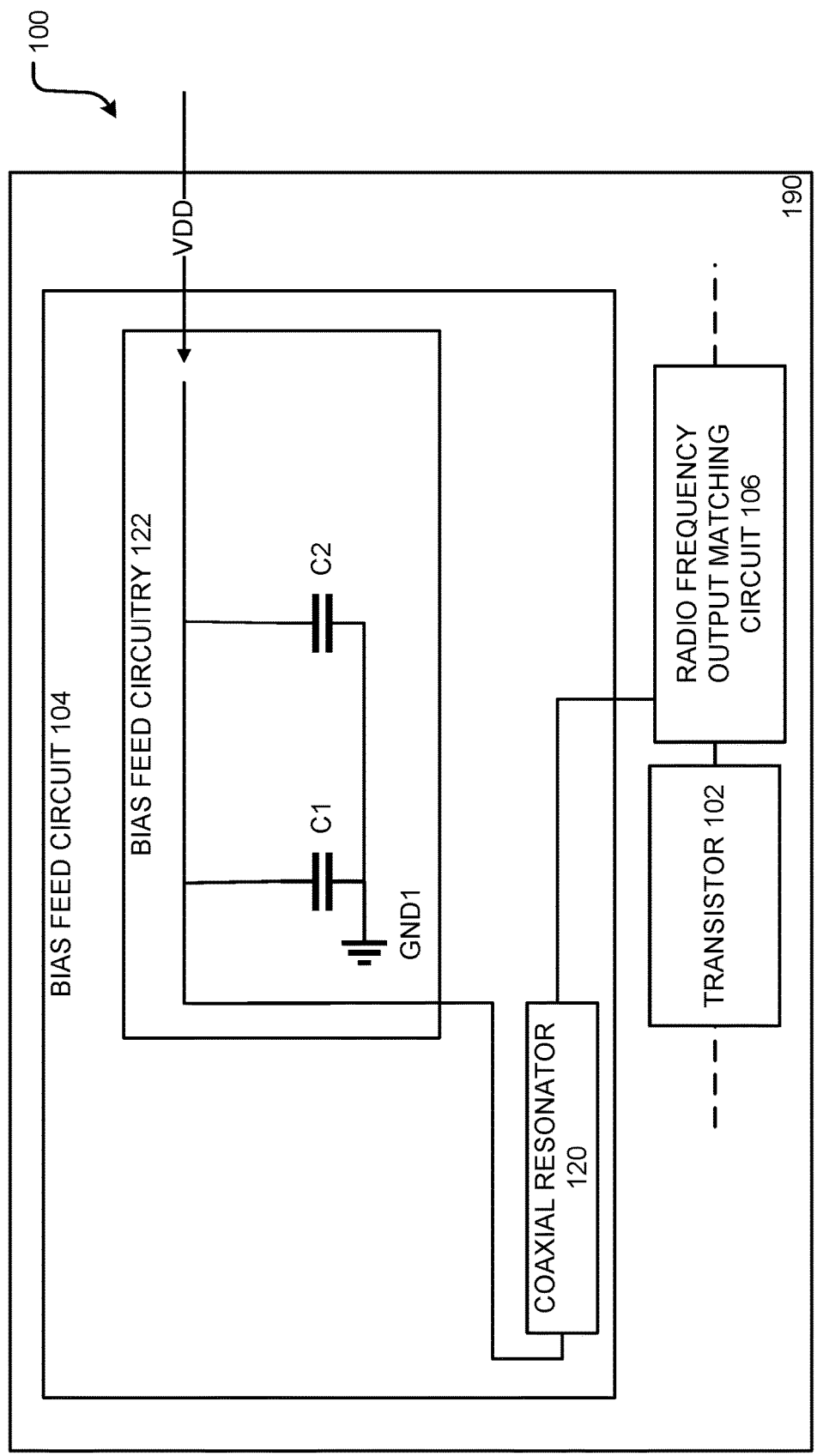
FIG. 2 illustrates a physical and electrical schematic of a bias feed circuit of the packaged RFPA according to FIG. 1.

FIG. 2 illustrates a physical and electrical schematic of a bias feed circuit of the packaged RFPA according to FIG. 1.

In particular, FIG. 2 illustrates the bias feed circuit 104 together with the coaxial resonator 120 (other components of the RFPA package 100 are not shown for ease of illustration with dashed lines indicating portions that may be connected to other components). As illustrated in FIG. 2, the bias feed circuitry 122 may include an input that may receive the voltage VDD. Additionally, the bias feed circuitry 122 may include at least one capacitor connected to ground GND1. In one aspect, the bias feed circuitry 122 may include a capacitor C1 and a capacitor C2 connected in parallel to ground GND1. Additionally, the voltage VDD may be provided to the coaxial resonator 120.

The capacitor C1, the capacitor C2, and other capacitors within the bias feed circuit 104 may include one or more shunt capacitors, one or more discrete multilayer capacitors, and/or the like. The capacitor C1, the capacitor C2, and other capacitors within the bias feed circuit 104 may be implemented to have optimal properties at the carrier RF frequency.

Figure 3:
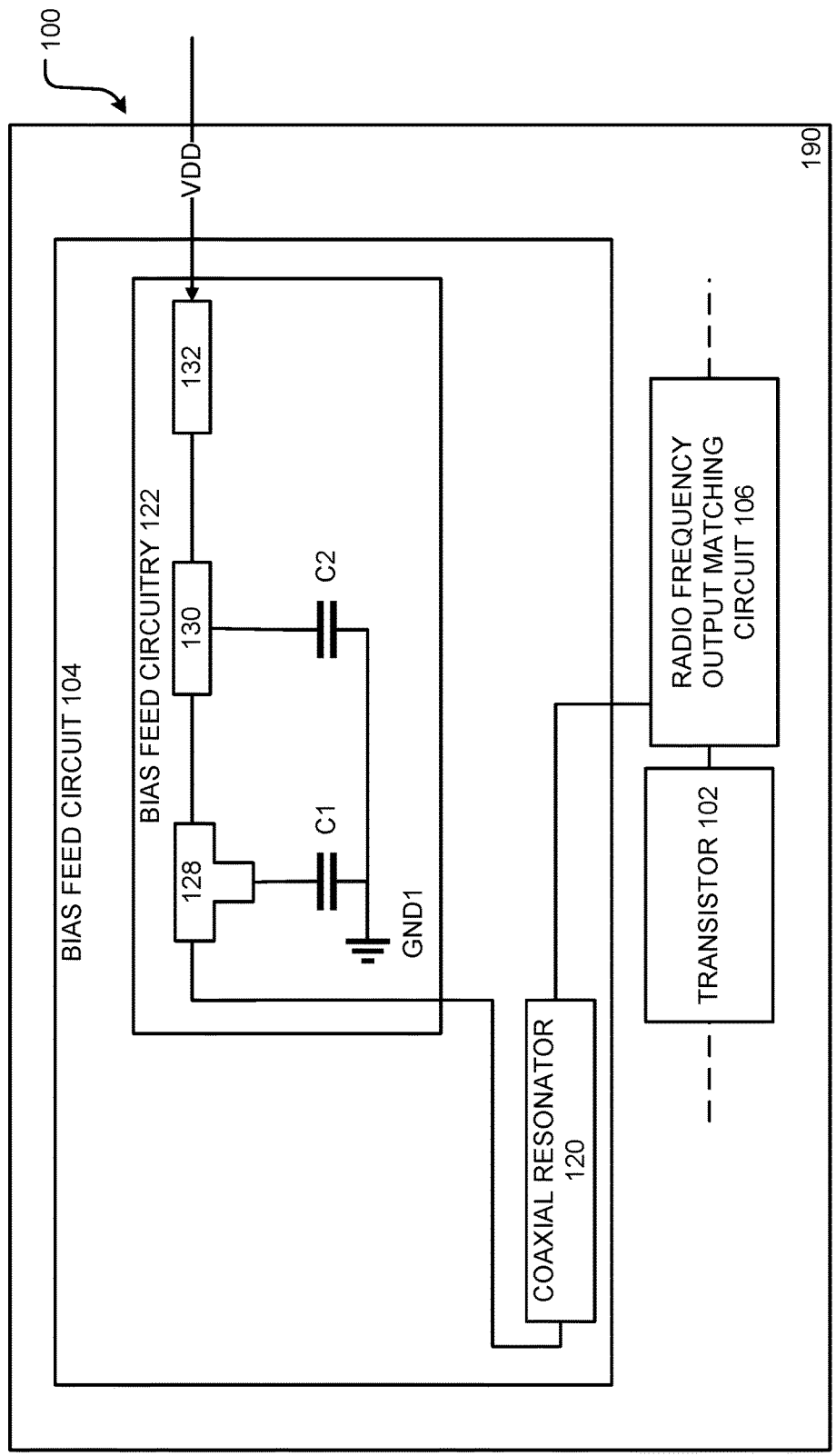
FIG. 3 illustrates a physical and electrical schematic of a bias feed circuit of the packaged RFPA according to FIG. 1.

FIG. 3 illustrates a physical and electrical schematic of a bias feed circuit of the packaged RFPA according to FIG. 1.

In particular, FIG. 3 illustrates that the bias feed circuitry 122 may include a microstrip tee 128, a first microstrip 130, and a second microstrip 132 (other components of the RFPA package 100 are not shown for ease of illustration with dashed lines indicating portions that may be connected to other components).

As illustrated in FIG. 3, the bias feed circuitry 122 may include an input that may receive the voltage VDD by the second microstrip 132. The second microstrip 132 may connect to the first microstrip 130. The first microstrip 130 may connect to the capacitor C2 and to the microstrip tee 128. The microstrip tee 128 may connect to the capacitor C1 and to the coaxial resonator 120.

The capacitor C1 and the capacitor C2 may be connected in parallel to ground GND1. Additionally, the voltage VDD may be provided to the coaxial resonator 120.

The capacitor C1, the capacitor C2, the ground GND1, the coaxial resonator 120, the microstrip tee 128, the first microstrip 130, the second microstrip 132, as well as other components may include connections that may include leads, wire bonding, an adhesive, soldering, sintering, eutectic bonding, thermal compression bonding, ultrasonic bonding/welding, a clip component, and/or the like as described herein. In one aspect, the connections may utilize the same type of connection. In one aspect, the connections may utilize different types of connections.

Figure 4:
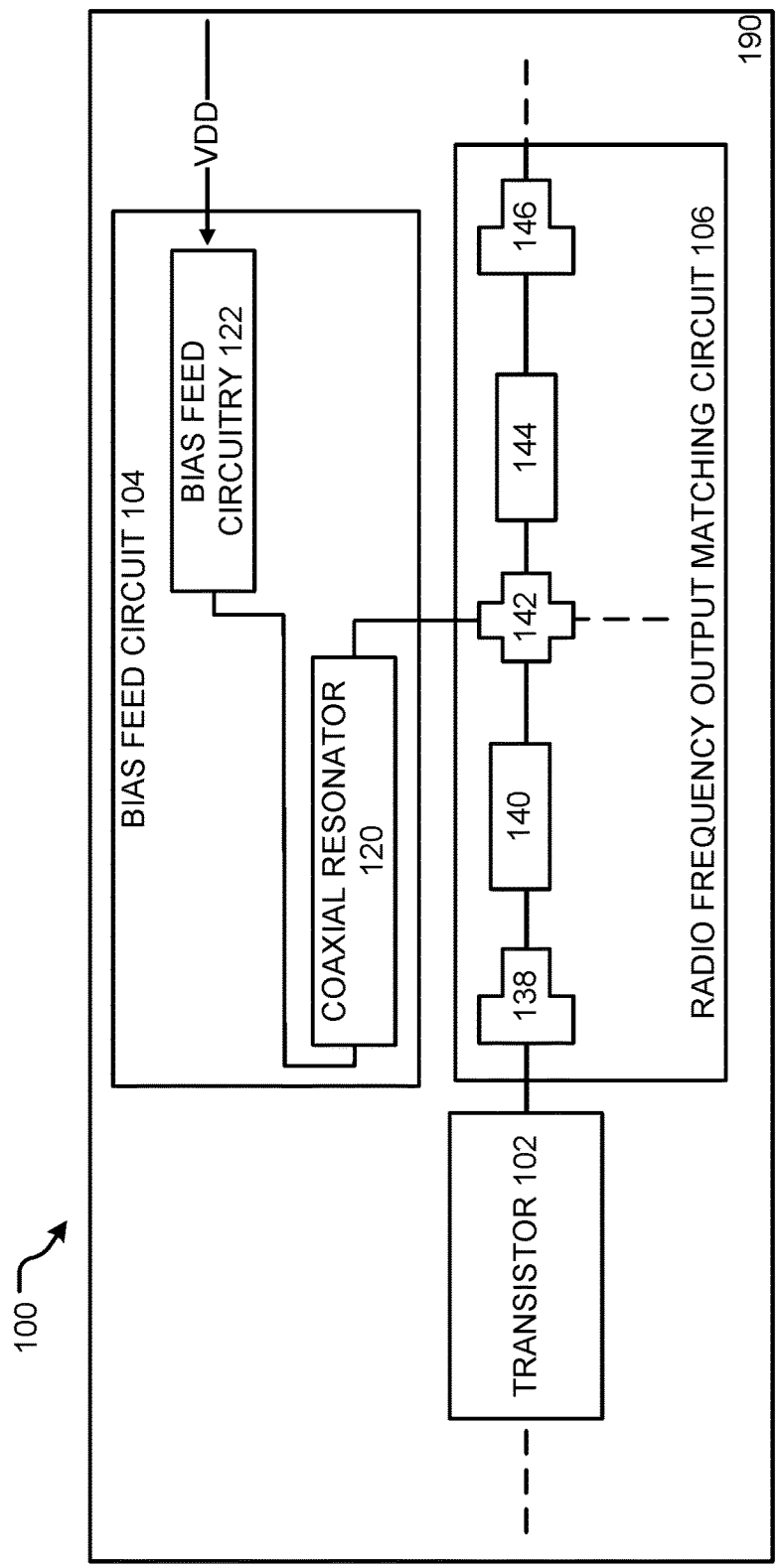
FIG. 4 illustrates a physical and electrical schematic of an output matching circuit of the packaged RFPA according to FIG. 1.

FIG. 4 illustrates a physical and electrical schematic of an output matching circuit of the packaged RFPA according to FIG. 1.

In particular, FIG. 4 illustrates exemplary details of the radio frequency output matching circuit 106 (other components of the RFPA package 100 are not shown for ease of illustration with dashed lines indicating portions that may be connected to other components). In this regard, the radio frequency output matching circuit 106 may include a first junction 138, a first microstrip 140, a second junction 142, a second microstrip 144, and a third junction 146.

The first junction 138 may be connected to the drain of the RF power transistor 102 and may be connected to the first microstrip 140. The first microstrip 140 may be connected to the first junction 138 and to the second junction 142. The second junction 142 may be connected to the first microstrip 140, the coaxial resonator 120, and to the second microstrip 144. The second microstrip 144 may be connected to the third junction 146. The third junction 146 may be connected to the second microstrip 144 and connected to the capacitor 180 and the output lead 112. In one aspect, the first junction 138 and the third junction 146 may be implemented as an asymmetric junction. The connections therebetween may be through intervening structures or components, or may be direct connections. The connections may include wire bonding, an adhesive, soldering, sintering, eutectic bonding, thermal compression bonding, ultrasonic bonding/welding, a clip component, and/or the like as described herein. In one aspect, the connections may utilize the same type of connection. In one aspect, the connections may utilize different types of connections.

In one aspect, the RFPA package 100 illustrated in FIG. 1, FIG. 2, FIG. 3, and FIG. 4 may be implemented with a radiofrequency input of 50 ohms and a radio frequency output of 50 ohms. In one aspect, the RFPA package 100 illustrated in FIG. 1, FIG. 2, FIG. 3, and FIG. 4 may be implemented with a frequency of 1.8 GHz-2.2 GHz. In one aspect, the RFPA package 100 illustrated in FIG. 1, FIG. 2, FIG. 3, and FIG. 4 may be implemented with an output RF peak power of 400 W. In one aspect, the RFPA package 100 illustrated in FIG. 1, FIG. 2, FIG. 3, and FIG. 4 may be implemented as a class AB circuit. In one aspect, the RFPA package 100 illustrated in FIG. 1, FIG. 2, FIG. 3, and FIG. 4 may be implemented as a class AB circuit with a frequency of 1.8 GHz-2.2 GHz and an output RF peak power of 400 W. In one aspect, the RFPA package 100 illustrated in FIG. 1, FIG. 2, FIG. 3, and FIG. 4 may be implemented to have a peak power of 10 W-2 kW, a peak power of 10 W-100 W, a peak power of 100 W-500 W, a peak power of 500 W-1 kW, or a peak power of 1.5 kW-2 kW.

Figure 5:
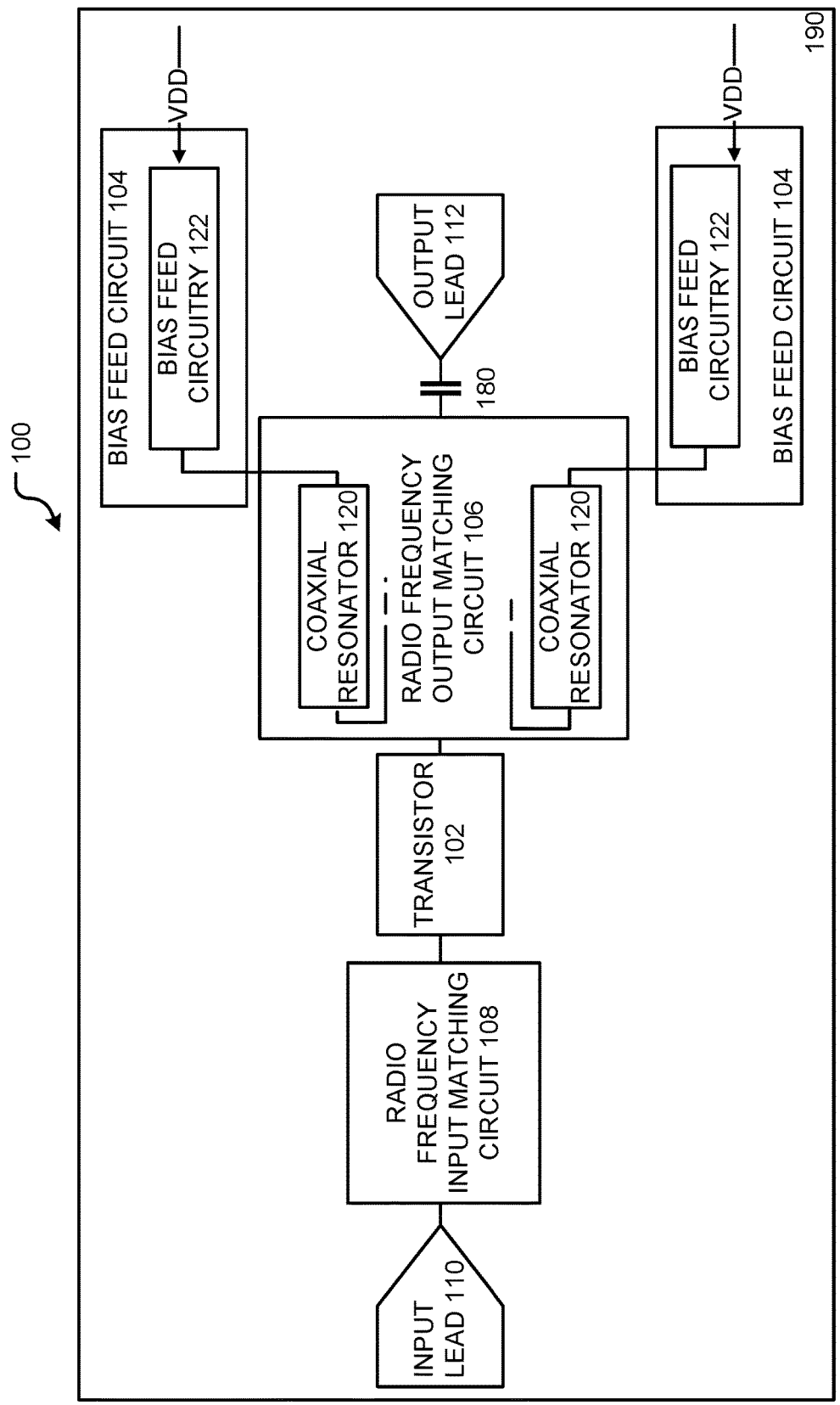
FIG. 5 illustrates a functional block diagram of a packaged RFPA according to the disclosure.

FIG. 5 illustrates a functional block diagram of a packaged RFPA according to the disclosure.

Figure 6:
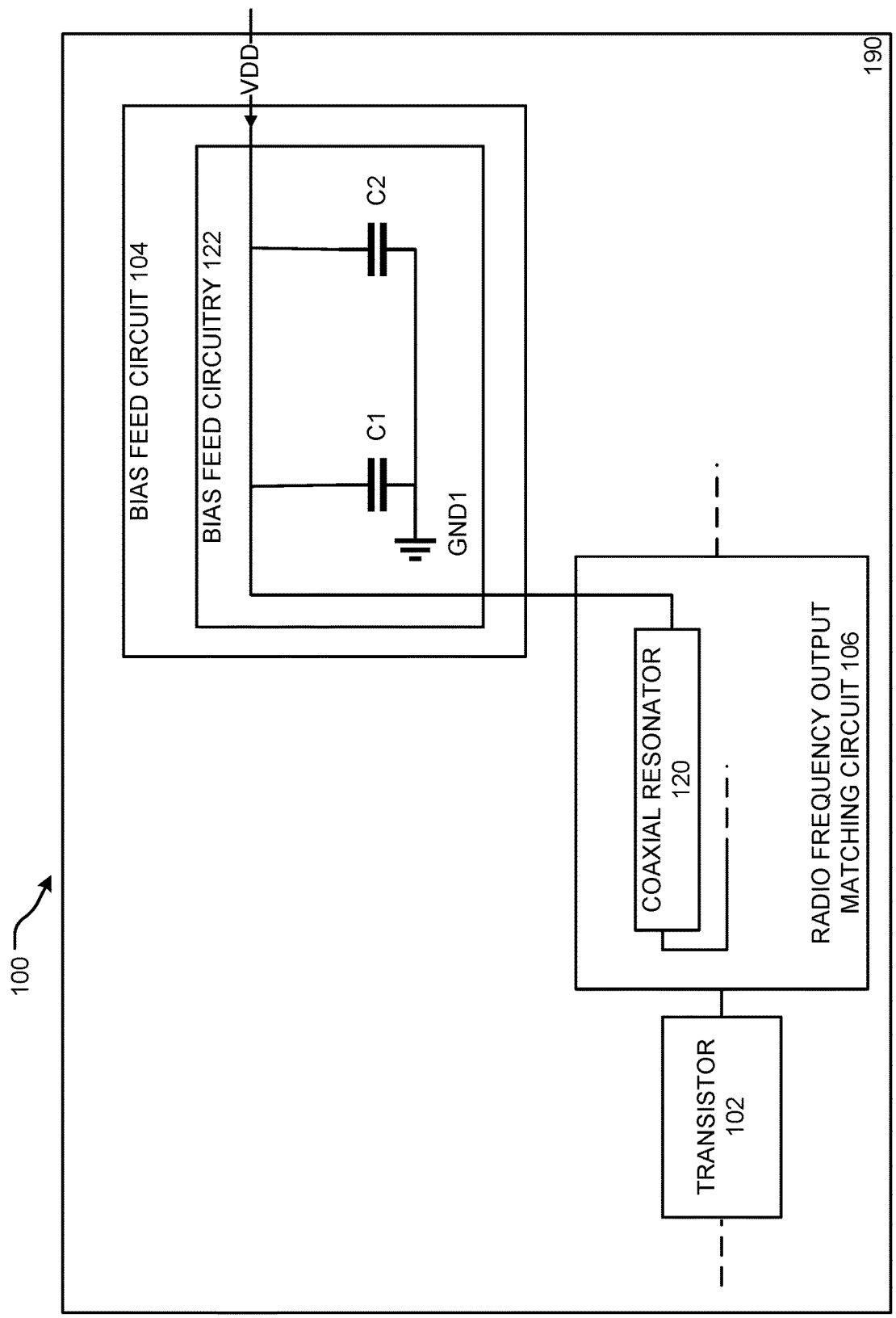
FIG. 6 illustrates a physical and electrical schematic of a bias feed circuit of the packaged RFPA according to FIG. 5.

FIG. 6 illustrates a physical and electrical schematic of a bias feed circuit of the packaged RFPA according to FIG. 5.

Figure 7:
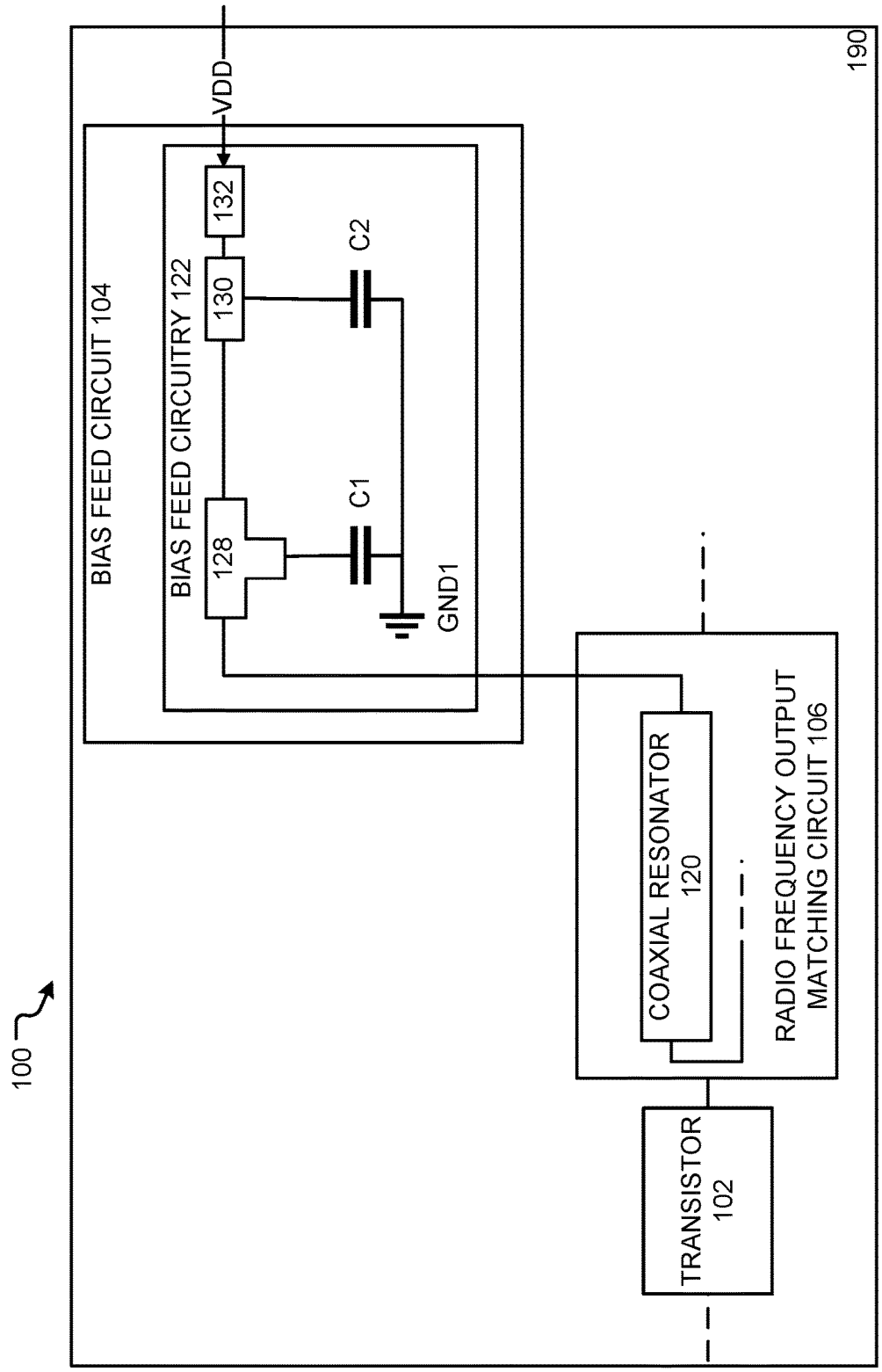
FIG. 7 illustrates a physical and electrical schematic of a bias feed circuit of the RF power transistor according to FIG. 5.

FIG. 7 illustrates a physical and electrical schematic of a bias feed circuit of the packaged RFPA according to FIG. 5.

Figure 8:
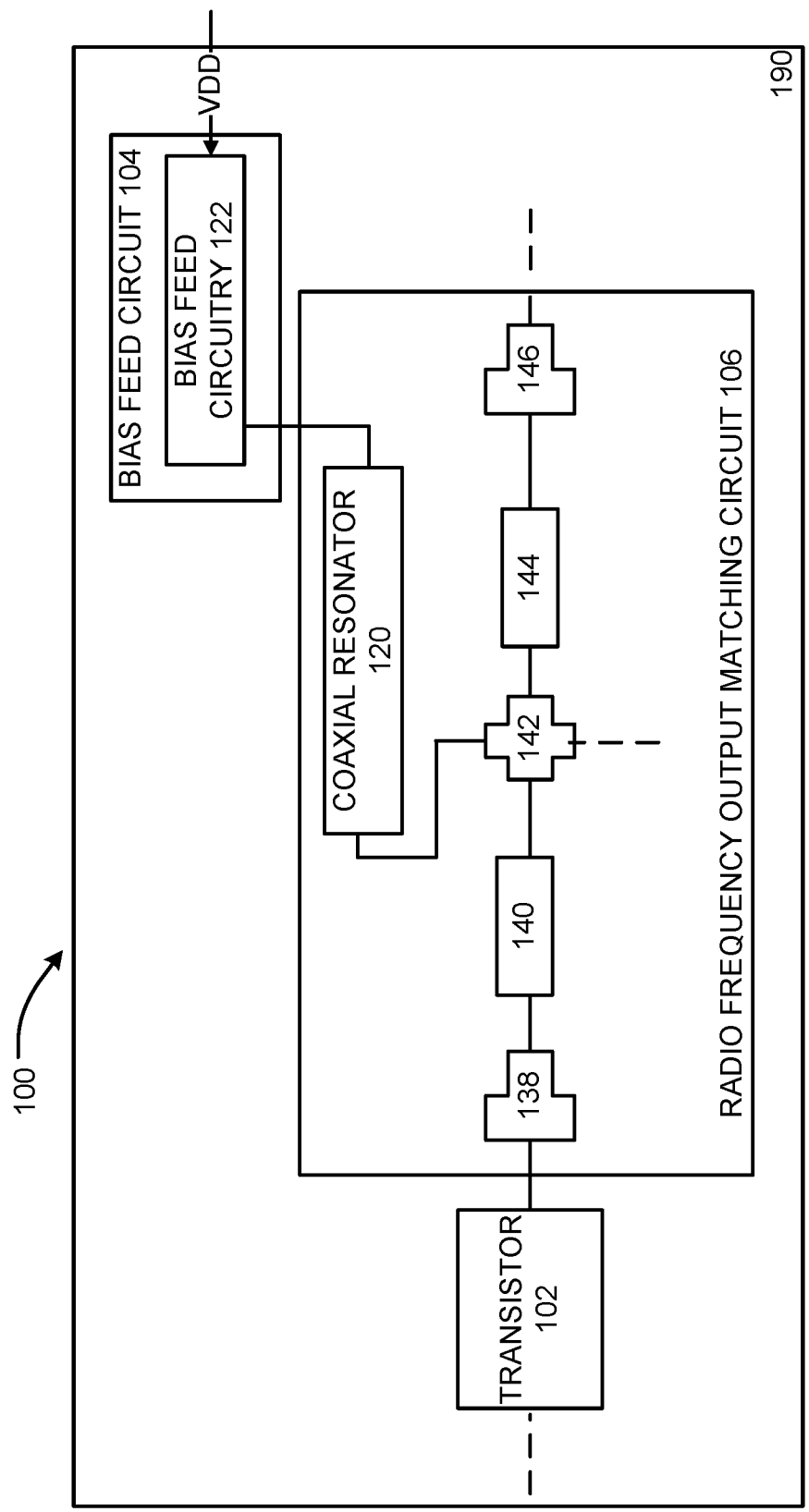
FIG. 8 illustrates a physical and electrical schematic of an output matching circuit of the packaged RFPA according to FIG. 5.

FIG. 8 illustrates a physical and electrical schematic of an output matching circuit of the packaged RFPA according to FIG. 5.

In particular, the RFPA package 100 illustrated in FIG. 5, FIG. 6, FIG. 7, and FIG. 8 may include any one or more of the components and configurations of the RFPA package 100 as described herein. Additionally, FIG. 5, FIG. 6, FIG. 7, and FIG. 8 illustrate that the bias feed circuit 104 may connect to the radio frequency output matching circuit 106 through a coaxial resonator 120. In particular, an output of the coaxial resonator 120 may be connected to the radio frequency output matching circuit 106, may be connected to the radio frequency output matching circuit 106 through intervening structures or components, or may be directly connected to the radio frequency output matching circuit 106. In one aspect, the coaxial resonator 120 may be soldered to the radio frequency output matching circuit 106. In one aspect, the coaxial resonator 120 may be implemented in the radio frequency output matching circuit 106.

Accordingly, the RFPA package 100 implementing the coaxial resonator 120 arranged, configured, and/or implemented as described with respect to FIG. 5, FIG. 6, FIG. 7, and FIG. 8 may have a circuit size having a reduced length and/or area, a reduced effective baseband ESR, and/or an increased video bandwidth as described herein. In this regard, coaxial resonators have been implemented for various typical applications. However, the disclosure has set forth arrangements, configurations, and/or implementations as described herein that have a surprising and/or unexpected result in reducing circuit size length and/or area, reducing effective baseband ESR, and/or increasing video bandwidth. In particular, the disclosure has set forth arrangements, configurations, and/or implementations as described herein that have a surprising and/or unexpected result in reducing circuit size length and/or area, reducing effective baseband ESR, and/or increasing video bandwidth in conjunction with a high-power and/or high-frequency transistor implementation of the RF power transistor 102.

In one aspect, the RFPA package 100 illustrated in FIG. 5, FIG. 6, FIG. 7, and FIG. 8 may be implemented with a radio frequency input of 50 ohms and a radio frequency output of 50 ohms. In one aspect, the RFPA package 100 illustrated in FIG. 5, FIG. 6, FIG. 7, and FIG. 8 may be implemented with a frequency of 1.8 GHz-2.2 GHz. In one aspect, the RFPA package 100 illustrated in FIG. 5, FIG. 6, FIG. 7, and FIG. 8 may be implemented with an output RF peak power of 400 W. In one aspect, the RFPA package 100 illustrated in FIG. 5, FIG. 6, FIG. 7, and FIG. 8 may be implemented as a class AB circuit. In one aspect, the RFPA package 100 illustrated in FIG. 5, FIG. 6, FIG. 7, and FIG. 8 may be implemented as a class AB circuit with a frequency of 1.8 GHz-2.2 GHz and an output RF peak power of 400 W. In one aspect, the RFPA package 100 illustrated in FIG. 5, FIG. 6, FIG. 7, and FIG. 8 may be implemented to have a peak power of 10 W-2 kW, a peak power of 10 W-100 W, a peak power of 100 W-500 W, a peak power of 500 W-1 kW, or a peak power of 1.5 kW-2 kW.

Figure 9:
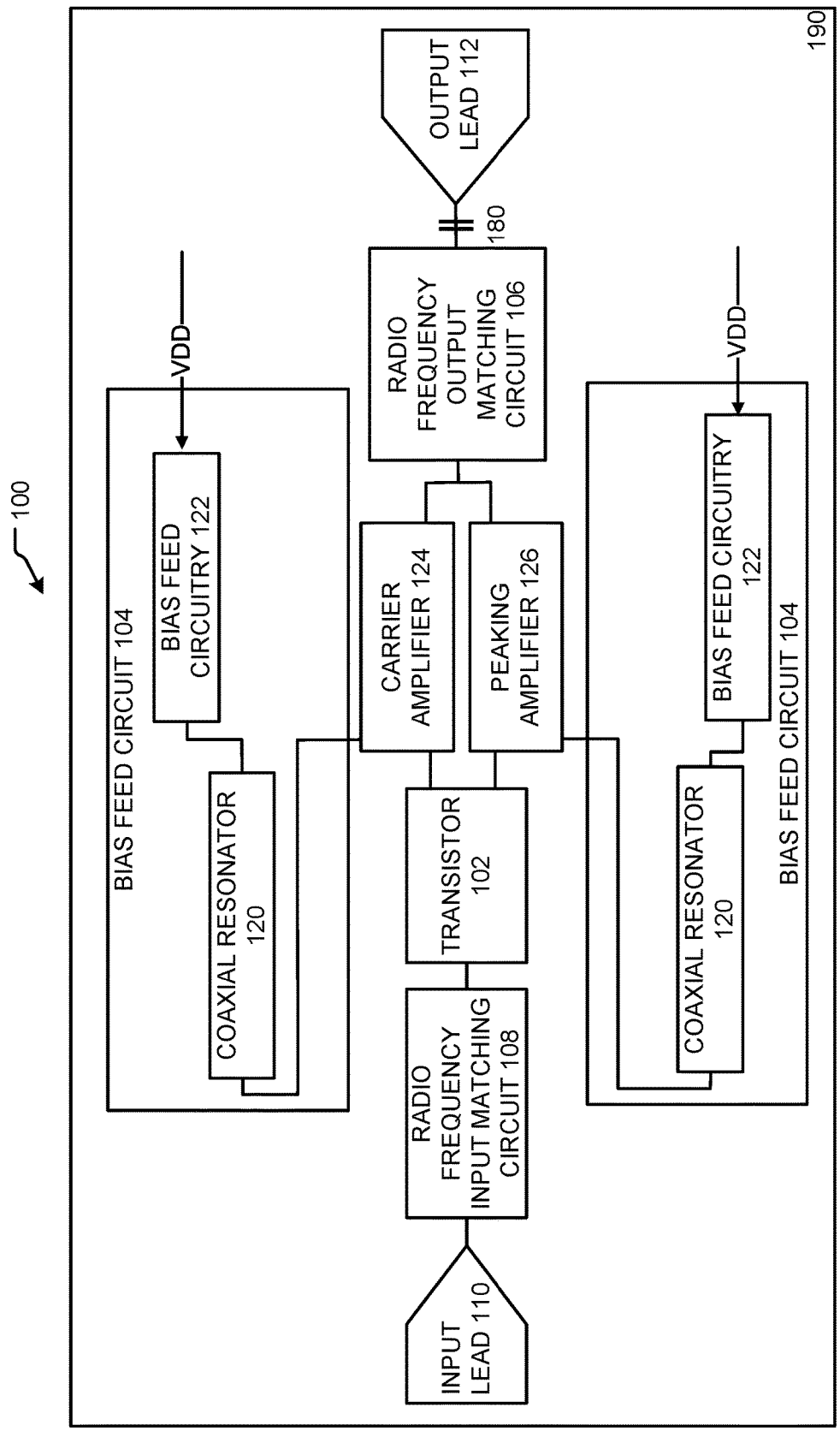
FIG. 9 illustrates a functional block diagram of a packaged RFPA according to the disclosure.

FIG. 9 illustrates a functional block diagram of a packaged RFPA according to the disclosure.

Figure 10:
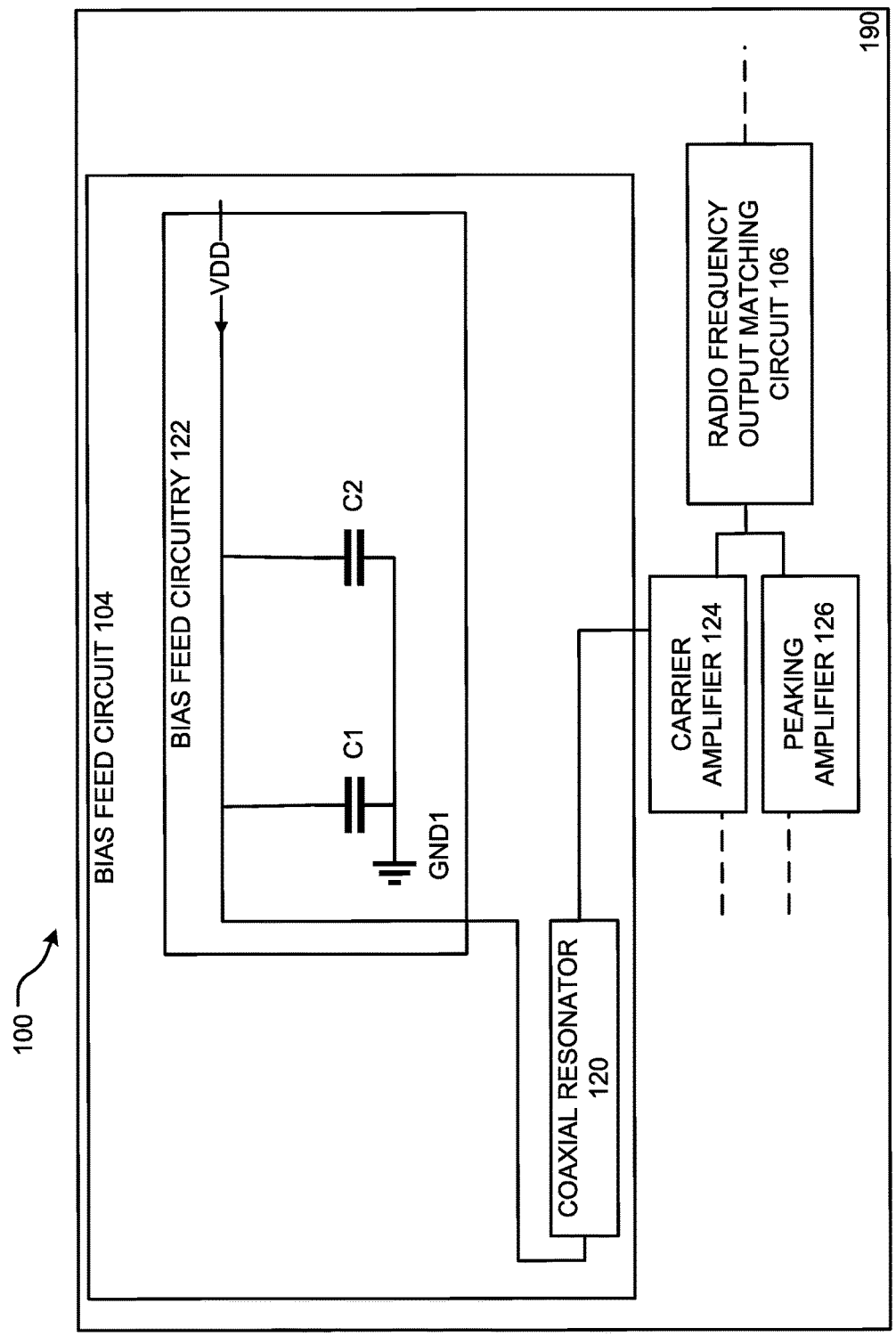
FIG. 10 illustrates a physical and electrical schematic of a bias feed circuit of the packaged RFPA according to FIG. 9.

FIG. 10 illustrates a physical and electrical schematic of a bias feed circuit of the packaged RFPA according to FIG. 9.

Figure 11:
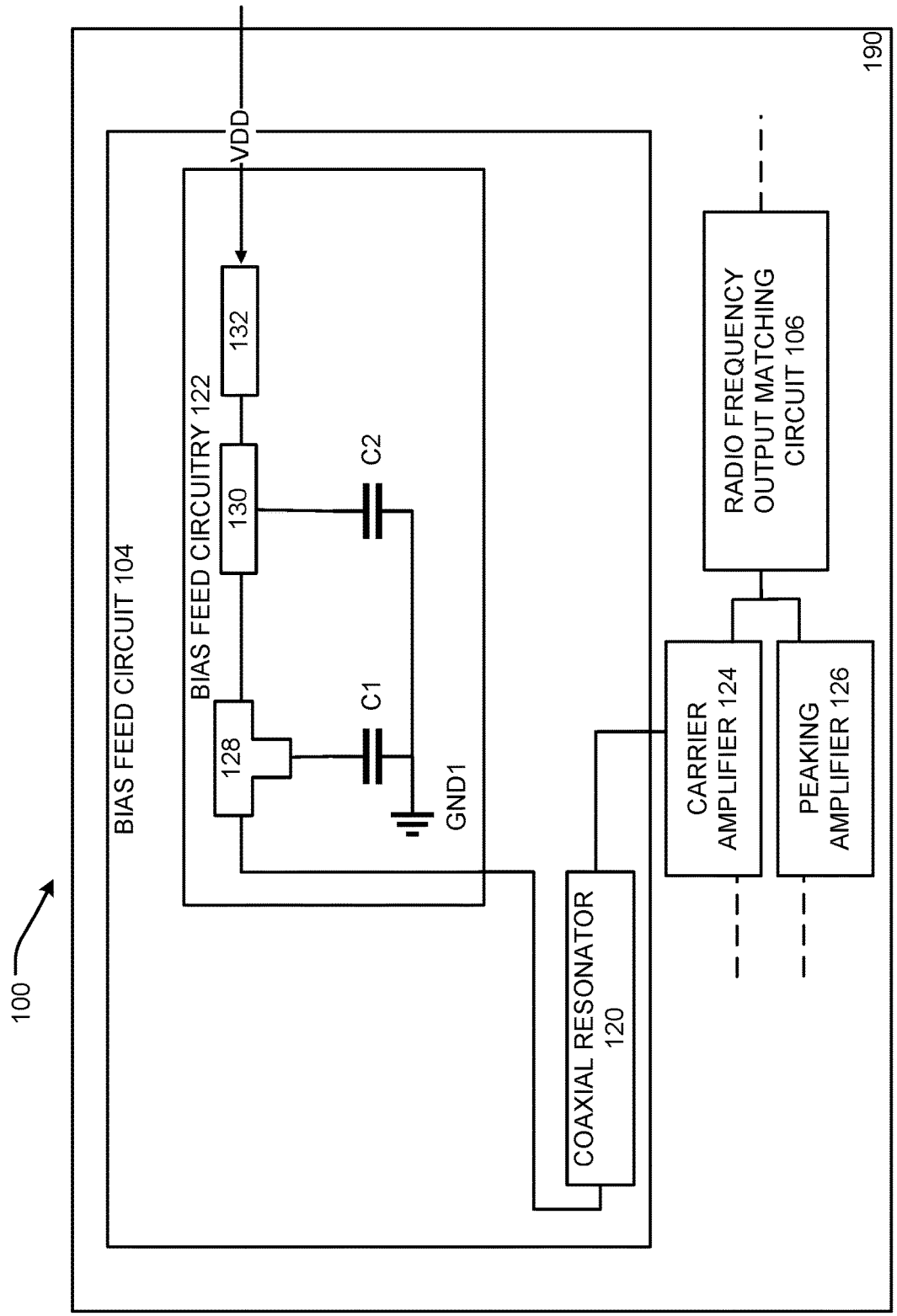
FIG. 11 illustrates a physical and electrical schematic of a bias feed circuit of the packaged RFPA according to FIG. 9.

FIG. 11 illustrates a physical and electrical schematic of a bias feed circuit of the packaged RFPA according to FIG. 9.

In particular, the RFPA package 100 illustrated in FIG. 9, FIG. 10, and FIG. 11 may include any one or more of the components and configurations of the RFPA package 100 as described herein. FIG. 9, FIG. 10, and FIG. 11 further illustrates that the RFPA package 100 may be implemented at least in part as a Doherty circuit having a carrier amplifier 124 and a peaking amplifier 126. In particular, the RFPA package 100 may include the carrier amplifier 124 and the peaking amplifier 126 configured such that the RFPA package 100 power-combines outputs of the carrier amplifier 124 and the peaking amplifier 126. In one aspect, the two amplifiers may be biased differently. In one aspect, the carrier amplifier 124 may operate at a normal Class AB or Class B. In one aspect, the peaking amplifier 126 may operate at Class C. Other operating classes are contemplated as well.

Additionally, FIG. 9, FIG. 10, and FIG. 11 illustrates that the bias feed circuit 104 may connect to the carrier amplifier 124 and/or the peaking amplifier 126 through the coaxial resonator 120. In one aspect, a first one of the bias feed circuit 104 may connect to the carrier amplifier 124 through the coaxial resonator 120; and a second one of the bias feed circuit 104 may connect to the peaking amplifier 126 through the coaxial resonator 120.

Accordingly, the RFPA package 100 implementing the coaxial resonator 120 arranged, configured, and/or implemented as described with respect to FIG. 9, FIG. 10, and FIG. 11 may have a circuit size having a reduced length and/or area, a reduced effective baseband ESR, and/or an increased video bandwidth as described herein. In this regard, coaxial resonators have been implemented for various typical applications. However, the disclosure has set forth arrangements, configurations, and/or implementations as described herein that have a surprising and/or unexpected result in reducing circuit size length and/or area, reducing effective baseband ESR, and/or increasing video bandwidth. In particular, the disclosure has set forth arrangements, configurations, and/or implementations as described herein that have a surprising and/or unexpected result in reducing circuit size length and/or area, reducing effective baseband ESR, and/or increasing video bandwidth in conjunction with a high-power and/or high-frequency transistor implementation of the RF power transistor 102.

In one aspect, the RFPA package 100 illustrated in FIG. 9, FIG. 10, and FIG. 11 may be implemented with a radiofrequency input of 50 ohms and a radio frequency output of 50 ohms. In one aspect, the RFPA package 100 illustrated in FIG. 9, FIG. 10, and FIG. 11 may be implemented with a frequency of 1.8 GHz-2.2 GHz. In one aspect, the RFPA package 100 illustrated in FIG. 9, FIG. 10, and FIG. 11 may be implemented with an output RF power of 500 W. In one aspect, the RFPA package 100 illustrated in FIG. 9, FIG. 10, and FIG. 11 may be implemented with a frequency of 1.8 GHz-2.2 GHz and an output RF peak power of 500 W. In one aspect, the RFPA package 100 illustrated in FIG. 9, FIG. 10, and FIG. 11 may be implemented to have a peak power of 10 W-2 kW, a peak power of 10 W-100 W, a peak power of 100 W-500 W, a peak power of 500 W-1 kW, or a peak power of 1.5 kW-2 kW.

Figure 12:
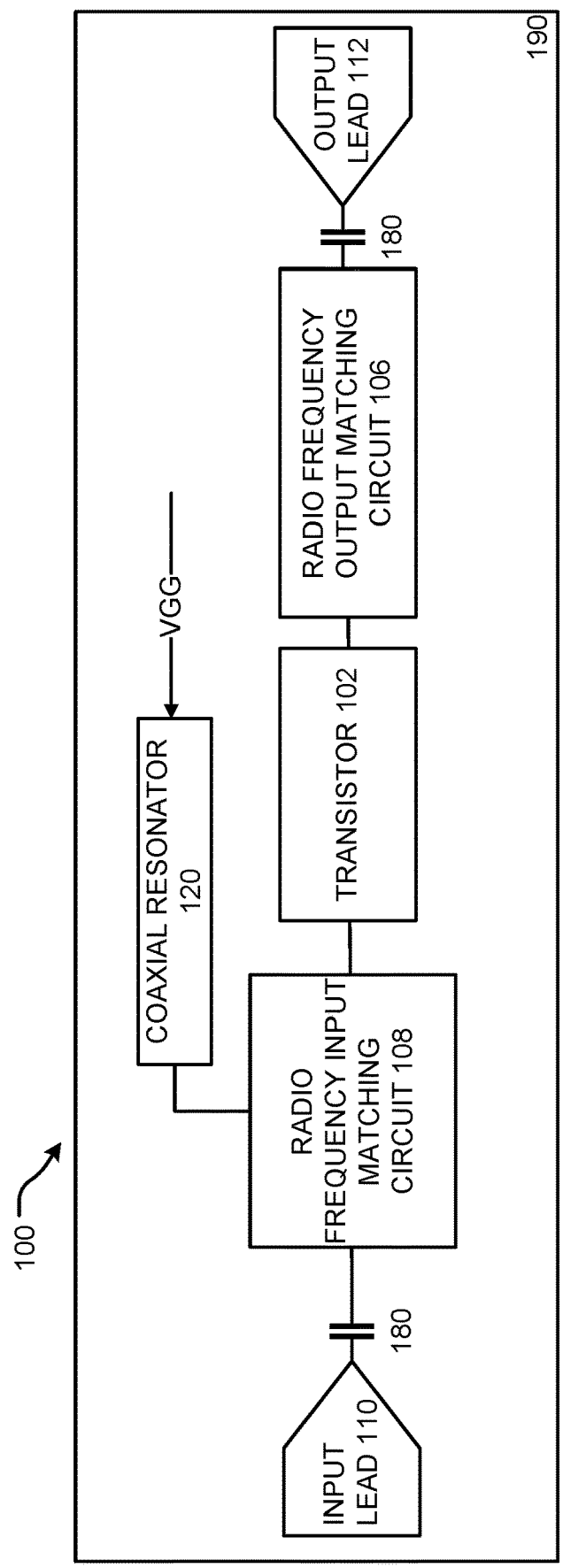
FIG. 12 illustrates a functional block diagram of a packaged RFPA according to the disclosure.

FIG. 12 illustrates a functional block diagram of a packaged RFPA according to the disclosure.

In particular, the RFPA package 100 illustrated in FIG. 12 may include any one or more of the components and configurations of the RF package 100 as described herein. FIG. 12 further illustrates an implementation of the radio frequency input matching circuit 108 that may connect to a capacitor 180 that may be implemented as a blocking capacitor. The capacitor 180 may also connect to an output of the input lead 110. The radio frequency input matching circuit 108 may also connect to an input to the RF power transistor 102. The coaxial resonator 120 may have an input configured to receive a DC input bias VGG and the coaxial resonator 120 may have an output connected to the radio frequency input matching circuit 108.

The radio frequency input matching circuit 108 may provide impedance matching between the input lead 110 and a gate G of the RF power transistor 102. The radio frequency input matching circuit 108 may include one or more capacitors, one or more inductors, one or more resistors, and/or the like in order to provide impedance matching between the input lead 110 and a gate G of the RF power transistor 102.

Accordingly, the RFPA package 100 implementing the coaxial resonator 120 arranged, configured, and/or implemented as described with respect to FIG. 12 may have a circuit size having a reduced length and/or area, a reduced effective baseband ESR, and/or an increased video bandwidth. In this regard, coaxial resonators have been implemented for various typical applications. However, the disclosure has set forth arrangements, configurations, and/or implementations as described herein that have a surprising and/or unexpected result in reducing circuit size length and/or area, reducing effective baseband ESR, and/or increasing video bandwidth. In particular, the disclosure has set forth arrangements, configurations, and/or implementations as described herein that have a surprising and/or unexpected result in reducing circuit size length and/or area, reducing effective baseband ESR, and/or increasing video bandwidth in conjunction with a high-power and/or high-frequency transistor implementation of the RF power transistor 102.

The RFPA package 100 may be implemented to include a housing, an open cavity configuration, an over-mold configuration, and/or the like. In this regard, the RFPA package 100 may be implemented to include a housing. In particular, the housing may include a lid or other enclosure for protecting interconnects, circuit components, and/or the like.

Alternatively, the RFPA package 100 may be implemented to include an open cavity configuration. In particular, the open cavity configuration may utilize an open cavity package design. In some aspects, the open cavity configuration may include a lid or other enclosure for protecting interconnects, circuit components, and/or the like.

Alternatively, the RFPA package 100 may be implemented to include an over-mold configuration. In one aspect, the over-mold configuration may substantially surround the components. The over-mold configuration may be formed of a plastic, a mold compound, a plastic compound, a polymer, a polymer compound, a plastic polymer compound, and/or the like. The over-mold configuration may be injection or compression molded around the components, thereby providing protection for the components of the RFPA package 100 from the outside environment.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a solid mass of material by heat and/or pressure. The sintering process may operate without melting the material to the point of liquefaction. The sintering process may include sintering of metallic powders. The sintering process may include sintering in a vacuum. The sintering process may include sintering with the use of a protective gas.

The eutectic bonding of the disclosure may utilize a bonding process with an intermediate metal layer that may form a eutectic system. The eutectic system may be used between surfaces to be connected. The eutectic bonding may utilize eutectic metals that may be alloys that transform from solid to liquid state, or from liquid to solid state, at a specific composition and temperature without passing a two-phase equilibrium. The eutectic alloys may be deposited by sputtering, dual source evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

In particular aspects, the RF power transistor 102 of the disclosure may be utilized in wireless base stations that connect to a wireless device. In further aspects, the RF power transistor 102 of the disclosure may be utilized in amplifiers implemented by wireless base stations that connect to a wireless device. In further aspects, the RF power transistor 102 of the disclosure may be utilized in wireless devices. In further aspects, the RF power transistor 102 of the disclosure may be utilized in amplifiers implemented in wireless devices.

In this disclosure it is to be understood that reference to a wireless device is intended to encompass electronic devices such as mobile phones, tablet computers, gaming systems, MP3 players, personal computers, PDAs, user equipment (UE), and the like. A "wireless device" is intended to encompass any compatible mobile technology computing device that can connect to a wireless communication network, such as mobile phones, mobile equipment, mobile stations, user equipment, cellular phones, smartphones, handsets, wireless dongles, remote alert devices, Internet of things (IoT) based wireless devices, or other mobile computing devices that may be supported by a wireless network. The wireless device may utilize wireless communication technologies like GSM, CDMA, wireless local loop, Wi-Fi, WiMAX, other wide area network (WAN) technology, 3G technology, 4G technology, 5G technology, LTE technology, and/or the like.

In this disclosure it is to be understood that reference to a wireless base station is intended to cover base transceiver station (BTS), node B devices, Base Station (BS) devices, evolved node B devices, and the like that facilitate wireless communication between wireless devices and a network. The wireless base station and/or the network may utilize wireless communication technologies like GSM, CDMA, wireless local loop, Wi-Fi, WiMAX, other wide area network (WAN) technology, 3G technology, 4G technology, 5G technology, LTE technology, and the like.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A packaged RF power amplifier (RFPA) configured to increase video bandwidth comprising:
   at least one transistor;
   an input lead coupled to the at least one transistor;
   a ground terminal coupled to the transistor;
   an output lead coupled to the at least one transistor;
   an output matching circuit coupled to the output lead and to the at least one transistor;
   at least one bias feed circuit coupled to the at least one transistor; and
   at least one coaxial resonator coupled between the at least one transistor and the at least one bias feed circuit,
   wherein the at least one bias feed circuit is configured to apply a DC bias voltage to the at least one transistor; and
   wherein the at least one coaxial resonator is configured to present an RF open function and/or an RF filtering function.

2. The packaged RF power amplifier (RFPA) according to claim 1 wherein:
   the at least one coaxial resonator is arranged with at least one of the following:
   the at least one bias feed circuit and the output matching circuit; and
   the at least one bias feed circuit is connected to the output matching circuit.

3. The packaged RF power amplifier (RFPA) according to claim 1 wherein:
   the at least one transistor comprises a GaN based transistor; and
   the at least one bias feed circuit is connected to a drain of the at least one transistor through the at least one coaxial resonator.

4. The packaged RF power amplifier (RFPA) according to claim 1 wherein:
   the at least one transistor comprises a LDMOS based transistor.

5. The packaged RF power amplifier (RFPA) according to claim 1 wherein the at least one coaxial resonator is configured to have a length and/or an area that is 10%-60% less than a microstrip drain bias feed component.

6. The packaged RF power amplifier (RFPA) according to claim 1 wherein the at least one coaxial resonator is configured to have an effective baseband equivalent series resistance (ESR) that is less than a microstrip drain bias feed component.

7. The packaged RF power amplifier (RFPA) according to claim 1 wherein the at least one coaxial resonator is configured to have an effective baseband equivalent series resistance (ESR) that is 10%-60% less than a microstrip drain bias feed component.

8. The packaged RF power amplifier (RFPA) according to claim 1 wherein the at least one coaxial resonator is configured to increase a video bandwidth of the packaged RF power amplifier (RFPA) in comparison to a microstrip drain bias feed component.

9. The packaged RF power amplifier (RFPA) according to claim 1 wherein:
   the at least one bias feed circuit is connected to a drain of the at least one transistor through the at least one coaxial resonator.

10. The packaged RF power amplifier (RFPA) according to claim 1 further comprising:
    a carrier amplifier; and
    a peaking amplifier,
    implementing the at least one coaxial resonator as at least two coaxial resonators;
    coupling a first one of the at least two coaxial resonators to the carrier amplifier; and
    coupling a second one of the at least two coaxial resonators to the peaking amplifier.

11. The packaged RF power amplifier (RFPA) according to claim 1 further comprising:
    an input matching network,
    wherein the at least one coaxial resonator is configured to apply a DC bias voltage to the input matching network.

12. A process of implementing a packaged RF power amplifier (RFPA) to increase video bandwidth comprising:
    providing at least one transistor;
    coupling an input lead to the at least one transistor;
    coupling a ground terminal to the transistor;
    coupling an output lead to the at least one transistor;
    coupling an output matching circuit to the output lead and to the at least one transistor;
    coupling at least one bias feed circuit to the at least one transistor; and
    coupling at least one coaxial resonator between the at least one transistor and the at least one bias feed circuit,
    wherein the at least one bias feed circuit is configured to apply a DC bias voltage to the at least one transistor; and
    wherein the at least one coaxial resonator is configured to present an RF open function and/or an RF filtering function.

13. The process of implementing a packaged RF power amplifier (RFPA) according to claim 12 further comprising arranging the at least one coaxial resonator with at least one of the following: the at least one bias feed circuit and the output matching circuit.

14. The process of implementing a packaged RF power amplifier (RFPA) according to claim 12 wherein:
    the at least one transistor comprises a GaN based transistor; and
    the at least one bias feed circuit is connected to the output matching circuit.

15. The process of implementing a packaged RF power amplifier (RFPA) according to claim 12 wherein the at least one transistor comprises a LDMOS based transistor.

16. The process of implementing a packaged RF power amplifier (RFPA) according to claim 12 wherein the at least one coaxial resonator is configured to have a length and/or an area that is 10%-60% less than a microstrip drain bias feed component.

17. The process of implementing a packaged RF power amplifier (RFPA) according to claim 12 wherein the at least one coaxial resonator is configured to have an effective baseband equivalent series resistance (ESR) that is 10%-60% less than a microstrip drain bias feed component.

18. The packaged RF power amplifier (RFPA) according to claim 12 wherein the at least one coaxial resonator is configured to increase a video bandwidth of the packaged RF power amplifier (RFPA) in comparison to a microstrip drain bias feed component.

19. The packaged RF power amplifier (RFPA) according to claim 12 wherein:
the at least one bias feed circuit is connected to a drain of the at least one transistor through the at least one coaxial resonator.

20. The packaged RF power amplifier (RFPA) according to claim 12 further comprising:
a carrier amplifier; and
a peaking amplifier,
implementing the at least one coaxial resonator as at least two coaxial resonators;
coupling a first one of the at least two coaxial resonators to the carrier amplifier; and
coupling a second one of the at least two coaxial resonators to the peaking amplifier.

\* \* \* \* \*